United States Patent [19]
Jewell

[11] Patent Number: 5,859,864
[45] Date of Patent: Jan. 12, 1999

[54] EXTENDED WAVELENGTH LASERS HAVING A RESTRICTED GROWTH SURFACE AND GRADED LATTICE MISMATCH

[75] Inventor: Jack L. Jewell, Boulder, Colo.

[73] Assignee: Picolight Incorporated, Boulder, Colo.

[21] Appl. No.: 739,020

[22] Filed: Oct. 28, 1996

[51] Int. Cl.[6] ........................................ H01S 3/19
[52] U.S. Cl. .......................... 372/45; 257/190; 257/191
[58] Field of Search ...................... 372/45, 43; 257/191, 257/185, 190, 103; 359/248

[56] References Cited

U.S. PATENT DOCUMENTS

| | | |
|---|---|---|
| 4,806,996 | 2/1989 | Luryi . |
| 5,019,874 | 5/1991 | Inoue et al. . |
| 5,032,893 | 7/1991 | Fitzgerald, Jr. et al. . |
| 5,091,767 | 2/1992 | Bean et al. . |
| 5,156,995 | 10/1992 | Fitzgerald, Jr. et al. . |
| 5,294,808 | 3/1994 | Lo . |
| 5,315,430 | 5/1994 | Brennan et al. ................ 359/248 |
| 5,373,521 | 12/1994 | Takahashi ..................... 372/45 |
| 5,408,487 | 4/1995 | Uchida et al. .................. 372/45 |
| 5,448,084 | 9/1995 | Hoke et al. . |
| 5,471,076 | 11/1995 | Murakami et al. .............. 257/185 |
| 5,512,375 | 4/1996 | Green et al. . |
| 5,548,137 | 8/1996 | Fan et al. ..................... 257/191 |
| 5,610,413 | 3/1997 | Fan et al. ..................... 247/97 |
| 5,633,516 | 5/1997 | Mishima et al. ................ 257/190 |
| 5,679,965 | 10/1997 | Schetzina ..................... 257/103 |

FOREIGN PATENT DOCUMENTS 2215514A  9/1989  United Kingdom .

OTHER PUBLICATIONS

Koyama et al., "Wavelength Control of Vertical Cavity Surface–Emitting Lasers by Using Nonplanar MOCVD," *IEEE Photonics Technology Letters*, vol. 7 (Jan. 1995), pp. 10–12.

Kohama et al., "0.85μm Bottom–Emitting Vertical–Cavity Surface–Emitting Laser Diode Arrays Grown on AlGaAs Substrates," *Electronics Letters*, vol. 30 (Aug. 1994), pp. 1406–1407.

Coleman, James, *Quantum Well Lasers*, Academic Press, London, (1993) pp. 372–413, (no month available).

Chin et al., "Gas–Source Molecular Beam Epitaxial Growth, Characterization, and Light–Emitting Diode Application of $In_xGa_{1-x}P$ on GaP(100)," *Applied Physics Letters*, vol. 62 (May 1993), pp. 2369–2371.

Chin et al., "Heteroepitaxial Growth of $InP/In_{0.52}Ga_{0.48}As$ Structures on GaAs (100) by Gas–Source Molecular Beam Epitaxy," *Applied Physics Letters*, vol. 62 (May 1993), pp. 2708–2710.

(List continued on next page.)

*Primary Examiner*—Rodney B. Bovernick
*Assistant Examiner*—Yisun Song
*Attorney, Agent, or Firm*—Jagtiani & Associates

[57] ABSTRACT

An improved semiconductor structure is provided. The semiconductor structure comprises a first layer, the first layer having a restricted growth surface having a region with a transverse dimension D, the first layer having a first lattice constant $L_1$; a first, last and at least one intermediate transition layers, the transition layers forming a transition region, the transition region disposed above the first layer, the transition region having a vertical thickness T, and where at least one of the transition layers has lattice constants between $L_1$ and a second lattice constant $L_2$ where the first transition layer has a lattice constant closer to the $L_1$ than $L_2$ and the last transition layer has a lattice constant closer to the $L_2$ than $L_1$; and a second layer disposed on the transition region, the second layer having the second lattice constant $L_2$; wherein: the transition region has an average fractional change in lattice constant characterized by κ where κ=D/T) $\{(L_2-L_1)/L_1\}$, where $0<|\kappa|\leq 10$ and where $D\geq 2$ μm.

62 Claims, 4 Drawing Sheets

OTHER PUBLICATIONS

LeGoues et al., "Mechanism and Conditions for Anomalous Strain Relaxation In Graded Thin Films and Superlattices," *Journal of Applied Physics*, vol. 71 (May 1992), pp. 4230–4243.

Chang et al., "Strain Relaxation of Compositionally Graded InXGa1–XAs Buffer Layers for Modulation–Doped $In_{0.3}Ga_{0.7}As/In_{0.29}Al_{0.71}As$ Heterostructures," *Applied Physics Letters*, vol. 60 (Mar. 1992), pp. 1129–1131.

Fitzgerald et al., "Totally Relaxed $Ge_xSi_{1-x}$ Layers with Low Threading Dislocation Densities Grown on Si Substrates," *Applied Physics Letters*, vol. 59 (Aug. 1991), pp. 811–814.

Stinson et al., "High–Efficiency InGaP Light–Emitting Diodes on GaP Substrates," *Applied Physics Letters*, vol. 58 (May 1991), pp. 2012–2014.

Chand et al., "Elimination of Dark Line Defects in GaAs–on–Si by Post–Growth Patterning and Thermal Annealing," *Applied Physics Letters*, vol. 58 (Jan. 1991), pp. 74–76.

Guha et al., "Defect Reduction in Strained $In_xGa_{1-x}As$ Via Growth on GaAs (100) Substrates Patterned to Submicron Dimensions," *Applied Physics Letters*, vol. 56 (Jun. 1990), pp. 2304–2306.

Ribas et al., "Device Quality $In_{0.4}Ga_{0.6}As$ Grown on GaAs by Molecular Beam Epitaxy," *Applied Physics Letters*, vol. 57 (Sep. 1990), pp. 1040–1042.

Madhukar et al., "Realization of Low Defect density, Ultrathick, Strained InGaAs/GaAs Multiple Quantum Well Structures Via Growth on Patterned GaAs (100) Substrates," *Applied Physics Letters*, vol. 57 (Nov. 1990), pp. 2007–2009.

Omura et al., "Low Threshold Current 1.3 µm GaInAsP Lasers Grown on GaAs Substrates," *Electronics Letters*, vol. 25 (Dec. 1989), pp. 1718–1719.

Melman et al., "InGaAs/GaAs Strained Quantum Wells with a 1.3 µm Band Edge at Room Temperature," *Applied Physics Letters*, vol. 55 (Oct. 1989), pp. 1436–1438.

Yacobi et al., "Stress Variations and Relief in Patterned GaAs Grown on Mismatched Substrates," *Applied Physics Letters*, vol. 52 (Feb. 1988), pp. 555–557.

Fitzgerald et al., "Elimination of Interface Defects in Mismatched Epilayers by a Reduction in Growth Area," *Applied Physics Letters*, vol. 52 (May 1988), pp. 1496–1498.

Luryi et al., "New Approach to the High Quality Epitaxial Growth of Lattice–Mismatched Materials," *Applied Physics Letters*, vol. 49 (Jul. 1986), pp. 140–142.

Osbourn et al., "A $GaAs_xP_{1-x}$/GaP Strained–Layer Superlattice," *Applied Physics Letters*, vol. 41 (Jul. 1982), pp. 172–174.

Gourley et al., "Controversy of Critical Layer Thickness for InGaAs/GaAs Strained–Layer Epitaxy," *Applied Physics Letters*, vol. 52(5), (Feb. 1, 1978), pp. 377–379.

Matthews et al., "Accommodation of Misfit Across the Interface Between Crystals of Semiconducting Elements or Compounds," *Journal of Applied Physics*, vol. 41 (Aug. 1970), pp. 3800–3804.

Matthews et al., "Defects in Epitaxial Multilayers I: Misfit Dislocations," *Journal of Crystal Growth*, vol. 27 (1974), pp. 118–125.

Matthews et al., "Defects in Epitaxial Multilayers II: Dislocation Pile–Ups, Threading Dislocations, Slip Lines and Cracks," *Journal of Crystal Growth*, vol. 29 (1975), pp. 273–280, (no month available).

Matthews et al., "Defects in Epitaxial Multilayers III: Preparation of Almost Perfect Multilayers," *Journal of Crystal Growth*, vol. 32 (1976), pp. 265–273 (no month available).

Ishikawa et al., "Analysis of Temperature Dependent Optical Gain of Strained Quantum Well Taking Account of Carriers in the SCH Layer," *IEEE Photonics Technology Letters*, vol. 6 (Mar. 1994), pp. 344–347.

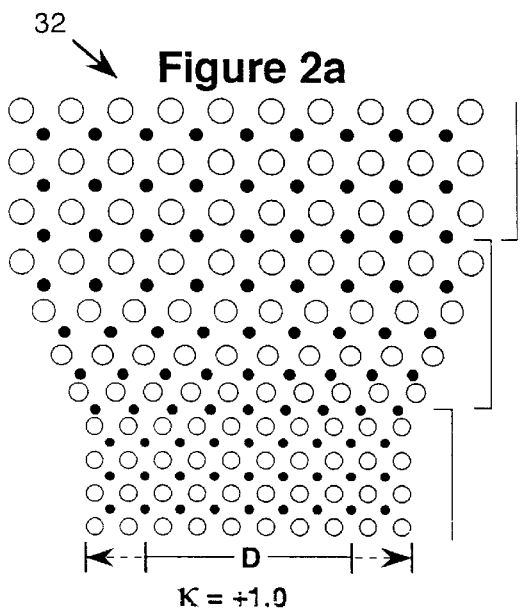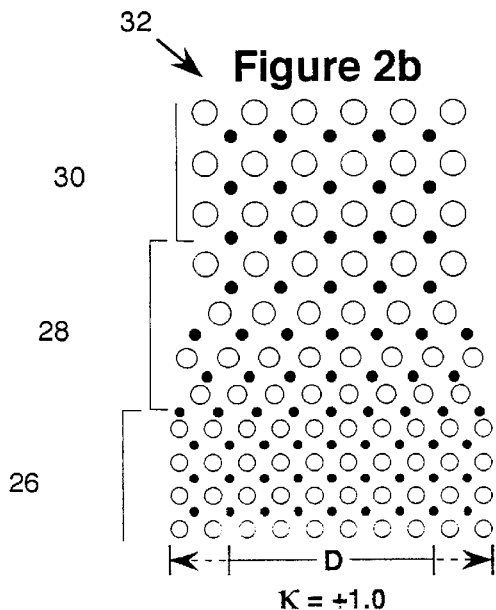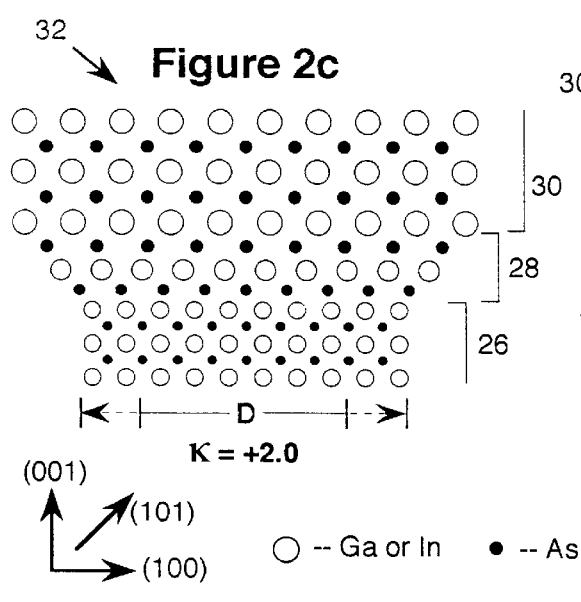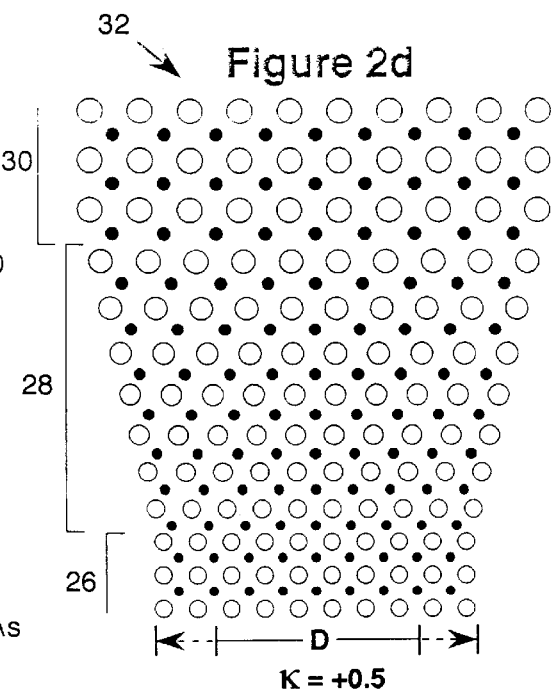

K = -1.0

K = +1.0 and -1.0

(001)
(101)
(100)

○ -- Ga or In    ● -- As

EXTENDED WAVELENGTH LASERS HAVING A RESTRICTED GROWTH SURFACE AND GRADED LATTICE MISMATCH

This invention is made with government support under contract number DASG60-96C-0135, awarded by the United States Department of Defense. The government may have certain rights in this invention.

CROSS-REFERENCE TO RELATED APPLICATIONS

This application makes reference to the following co-pending U.S. Patent Applications. The first application is U.S. application Ser. No. 08/574,165, entitled "Conductive Element with Lateral Oxidation Barrier," filed Dec. 18, 1995. The second application is U.S. application Ser. No. 08/659,942, entitled "Light Emitting Device Having an Electrical Contact Through a Layer containing Oxidized Material," filed Jun. 7, 1996. The third application is U.S. application Ser. No. 08/686,489 entitled "Lens Comprising at Least One Oxidized Layer and Method for Forming Same," filed Jul. 25, 1996. The fourth application is U.S. application Ser. No. 08/699,697 entitled "Aperture comprising an Oxidized Region and a Semiconductor Material," filed Aug. 19, 1996. The fifth application is U.S. application Ser. No. 08/721,769 entitled "Extended Wavelength Strained Layer Lasers Having Short Period Superlattices," filed Sep. 25, 1996. The sixth application is U.S. application Ser. 08/721,589 entitled "Extended Wavelength Strained Layer Lasers Having Strain Compensated Layers," filed Sep. 25, 1996. The seventh application is U.S. application Ser. No. 08/721,590 entitled "Extended Wavelength Strained Layer Lasers Having Nitrogen Disposed Therein," filed Sep. 25, 1996. These applications are hereby incorporated by reference.

BACKGROUND OF THE INVENTION

1. Field of the Invention

The present invention relates generally to the dislocation free epitaxial growth of materials having significantly large differences in lattice constant and contain semiconductor light sources such as LEDs and VCSELs, and more particularly to a semiconductor laser comprising a strained material which is grown on a restricted area surface and has a large lattice mismatch between a substrate and an active region in the semiconductor laser.

DESCRIPTION OF THE PRIOR ART

Vertical-Cavity Surface-Emitting Lasers (VCSELs), Edge Emitting Lasers (EELs) or Light Emitting Diodes (LEDs) are becoming increasingly important for a wide variety of applications including optical interconnection of integrated circuits, optical computing systems, optical recording and readout systems, and telecommunications. Vertically emitting devices have many advantages over edge-emitting devices, including the possibility for wafer scale fabrication and testing, and the possibility of forming two-dimensional arrays of the vertically emitting devices. The circular nature of the light output beams from VCSELs and surface emitting LEDs also make them ideally suited for coupling into optical fibers as in optical interconnects or other optical systems for integrated circuits and other applications.

For high-speed optical fiber communications, laser or LED emission wavelengths in the 1.3 $\mu$m through 1.55 $\mu$m region are desired. Standard silica fiber has zero dispersion near 1.3 $\mu$m and has a minimum loss near 1.55 $\mu$m. The need for semiconductor lasers emitting in this wavelength region has spawned worldwide development of such lasers. Group III–V semiconductors which emit light in the 1.3 through 1.55 $\mu$m region have lattice constants which are more closely matched to InP than to other binary III–V semiconductor substrates such as GaAs. Thus, essentially all commercial emitting lasers emitting at 1.3 through 1.55 $\mu$m are grown on InP substrates. These lasers are edge-emitting lasers which, unlike VCSELs, do not require high-reflectivity Distributed Bragg Reflectors (DBRs) to form their optical cavities.

The salient components of a VCSEL typically include two DBRs, and between them, a spacer which contains an active region having a length emitting material. The DBRs and active region form an optical cavity characterized by a cavity resonance at a resonant wavelength corresponding to a resonant photon energy. Unfortunately, it has proven difficult to produce effective DBRs on InP substrates. The available materials which lattice match Inp have produced mirrors which are extremely thick and lossy and have thus not resulted in efficient VCSELs.

While epitaxial growth of slightly-lattice-mismatched materials is undertaken routinely, materials which emit in the 1.31 $\mu$m through 1.55 $\mu$m region have lattice constants sufficiently removed from that of GaAs to make pseudomorphic epitaxial growth problematic. In this context, "pseudomorphic" means having a sufficiently low density of misfit dislocations such that lasers may be produced which have reasonably long lifetimes. For semiconductor lasers, the maximum acceptable density of misfit dislocations or other defects is generally much lower than for other semiconductor devices such as electro-optic modulators or LEDs. The problems have been sufficiently great to cause researchers to abandon such efforts and resort to less desirable hybrid approaches to producing 1.3 $\mu$m through 1.55 $\mu$m VCSELs.

Thus, the production of VCSELs emitting at 1.3 through 1.55 cm wavelengths has been inhibited by either of two problems. The problems result from the fact that VCSELs require laser-quality active materials and high-reflectivity DBR mirrors. These two problems are:

(1) when InP substrates are used, growth of the light emitting active material is straightforward, but production of efficient DBRs is difficult and has not been effective; and (2) when GaAs substrates are used, DBR production is straightforward, but efforts to grow laser-quality active material have been unsuccessful.

In order to realize such devices, as in the second case above, the misfit dislocations which form as a result of lattice mismatch at high In concentrations or from large epilayer thicknesses must be eliminated. Growth of the strained material on restricted-area surfaces, such as those provided by etching a substrate to form mesas, may allow growth of strained materials to thicknesses well above the Critical Thickness while still keeping free of misfit dislocations. The following is a summary of the prior approaches which are relevant to the problem of producing pseudomorphic semiconductor materials when the materials have a large lattice mismatch.

A detailed, quantitative account of the effects of growth on two-dimensionally-patterned substrates (mesas) is provided by Luryi et al., in an article entitled "New Approach to the High Quality Epitaxial Growth of Lattice-Mismatched Materials," *Applied Physics Letters*, vol. 49 (July 1986), pp. 140–142. Their analysis assumes an abrupt change of lattice constant. Dramatic increases in critical thickness are predicted, but only for very small pattern widths or very low lattice mismatches. Below a maximum width $D_{max}$, the critical thickness is infinite. In other words, the strain force at the interface reaches a saturated level before the onset of misfit dislocations and no longer increases with increasing layer thickness. For a 1% lattice mismatch, $D_{max}$ is about 2.5 μm (using their FIG. 3 and example of growth of GeSi on Si). Since the mechanical constants of Ge, Si, GaAs, InAs, and InP are not largely different, converting these calculations to InGaAs on GaAs will not cause major departures from the Ge/Si example. At a width of $2D_{max}$, the critical thickness is about twice the nominal critical thickness, i.e., the critical thickness for an infinitely- wide growth surface. Thus for the example of 1% lattice mismatch, a width of about 5 μm is required for doubling of the critical thickness. For increasing lattice mismatch, the minimum width decreases rapidly. Turning to FIG. 1a, a chart of Lattice Mismatch v. $D_{max}$ illustrates the area discussed by Luryi et al. and is enumerated by reference numeral 12. As may be seen, the maximum lattice mismatch treated by Luryi et al. is 4% and the largest $D_{max}$ is at or below 10 μm.

Fitzgerald et al., in an article entitled "Elimination of Interface Defects in Mismatched Epilayers by a Reduction in Growth Area," *Applied Physics Letters*, vol. 52 (May 1988), pp. 1496–1498, reports growth of $In_{0.05}Ga_{0.95}As$ layers 3500 Å thick on patterned GaAs in which the number of misfit dislocations was "nearly zero for 25 μm lateral dimensions," ie., $D_{max}$ equals 25 μm. This article goes on to state that the actual number of dislocations on 25 μm diameter mesas varied between 0 and 3. Therefore, this structure is not always dislocation free. There was an abrupt transition from the GaAs to $In_{0.05}Ga_{0.95}As$, and layers were >4 times the CT. Given the very small lattice mismatch of <0.36%, the estimated $D_{max}$ is about 40 μm by extrapolating the data from Luryi. Turning now to FIG. 1a, this data by Fitzgerald et al. is illustrated by filled circle 14. Fitzgerald et al. also reports that growth on mesas makes it possible to eliminate the generation of misfit dislocations through threading dislocations present in the substrate. The reader is also referred to U.S. Pat. Nos. 5,032,893 and 5,156,995, which discuss the subject matter of the above article by Fitzgerald et al.

Madhukar et al., in an article entitled "Realization of Low Defect density, Ultrathick, Strained InGaAs/GaAs Multiple Quantum Well Structures Via Growth on Patterned GaAs (100) Substrates," *Applied Physics Letters*, vol. 57 (November 1990), pp. 2007–2009, reported growth of InGaAs/GaAs multiple quantum wells to 2.4 μm total thickness on ~16×18 μm mesas. The average In concentration was about 6.7% (<0.48% average mismatch), and the estimated value of $D_{max}$ is 30 μm by extrapolating the data of Luryi. They also report that the central regions of the mesas appeared virtually free from structural defects, but the regions within 2–3 μm of the edges did not have good layering. They suspect migration of atoms to be responsible for the poor layering near the edges. Turning now to FIG. 1a, this data by Madhukar et al. is illustrated by filled circle 16.

Since VCSELs are presently the subject of intense research and development, a great deal of results and advancements are published periodically. The following is a list of documents which are relevant to the problem of producing pseudomorphic semiconductor materials when the materials have a large lattice mismatch.

Matthews et al., "Defects in Epitaxial Multilayers I: Misfit Dislocations," *Journal of Crystal Growth*, vol. 27 (1974), pp. 118–125.

Matthews et al., "Defects in Epitaxial Multilayers II: Dislocation Pile-Ups, Threading Dislocations, Slip Lines and Cracks," *Journal of Crystal Growth*, vol. 29 (1975), pp. 273–280.

Matthews et al., "Defects in Epitaxial Multilayers III: Preparation of Almost Perfect Multilayers," *Journal of Crystal Growth*, vol. 32 (1976), pp. 265–273.

Yacobi et al, "Stress Variations and Relief in Patterned GaAs Grown on Mismatched Substrates," *Applied Physics Letters*, vol. 52 (February 1988), pp. 555–557.

Guha et al., "Defect Reduction in Strained $In_xGa_{1-x}As$ Via Growth on GaAs (100) Substrates Patterned to Submicron Dimensions," *Applied Physics Letters*, vol. 56 (June 1990), pp. 2304–2306.

Chand et al., "Elimination of Dark Line Defects in GaAs-on-Si by Post-Growth Patterning and Thermal Annealing," *Applied Physics Letters*, vol. 58 (January 1991), pp. 74–76.

Koyama et al., "Wavelength Control of Vertical Cavity Surface-Emitting Lasers by Using Nonplanar MOCVD," *IEEE Photonics Technology Letters*, vol. 7 (January 1995), pp. 10–12.

In addition, the following U.S. Patents may be of interest: U.S. Pat. Nos. 5,512,375; 5,448,084; 5,294,808; 5,156,995; 5,091,767; 5,032,893; 5,019,874; and 4,806,996.

The prior art lacks any means to grow laser-quality materials having large mismatches, e.g. $\geq 1\%$, on mesa sizes appropriate for laser fabrication, e.g. $\geq 10$ μm, to thicknesses desired for many devices, e.g., well above their critical thicknesses for large-area growth. To achieve >1.3 μm emission on GaAs substrates, lattice mismatches of about 2.5% or greater are required. With 2.5% mismatch, mesa widths less than about 1000 Å are required for thick, defect-free growth. Growth of $\geq 2.2$ μm-emitting material on InP substrates is expected to require InAs or InAsSb which has >3.2% mismatch from InP. The prior art of patterned substrate growth is thus unable to address the goals of this work in any practical way.

The graded-lattice-constant layers taught by the prior art are completely lacking in ability to produce dislocation-free structures which are well above their respective critical thicknesses. Although references may speak of "almost perfect multilayers," or "device quality" material, at best this refers to an as-grown layer wherein the graded region below has very high defect density. If such layers were used in an active layer for a semiconductor laser, the underlying defects would quickly propagate into the active layer and the laser would be very short lived. This is the case for 1.3 μm lasers grown on GaAs of the type described by Omura et al., "Low Threshold Current 1.3 μm GaInAsP Lasers Grown on GaAs Substrates," Electronic Letters, vol. 25, no. 25, pp. 1718–1719, Dec. 7, 1989; or the structures described by Melman et al., "InGaAs/GaAs Strained Quantum Wells with a 1.3 μm Band Edge at Room Temperature," Applied Physics Letters, vol. 55, pp. 1436–1438, Oct. 2, 1989.

SUMMARY OF THE INVENTION

It is therefore an object of the present invention to provide a semiconductor structure which will provide lattice matching between two layers having a large difference in lattice constant.

It is a further object to provide an extended wavelength laser, on a GaAs substrate, which may emit at 1.3 μm or greater.

It is a further object to provide a laser having a long life and being easily manufacturable.

It is yet another object to provide various techniques which may be utilized in combination with an average sum of In and Sb concentrations of greater than 35%, of the type three semiconductor material, to reduce the peak transition energy of a device, having a GaAs substrate, to allow for an emission wavelength of 1.3 μm or greater.

It is yet another object to provide a superlattice structure on a GaAs substrate which reduces the peak transition energy sufficiently to allow for an emission wavelength of 1.3 μm or greater.

It is yet another object to provide a strain compensated quantum well on a GaAs substrate which reduces the peak transition energy sufficiently to allow for an emission wavelength of 1.31 μm or greater or greater on a GaAs substrate.

It is yet another object to provide an active region, on a GaAs substrate, which contains nitrogen which reduces the peak transition energy sufficiently to allow for an emission wavelength of 1.3 μm or greater.

According to one broad aspect of the present invention, there is provided a semiconductor structure, the semiconductor structure comprising: a first layer, the first layer having a restricted growth surface having a region with a transverse dimension D, the first layer having a first lattice constant $L_1$; a first, last and at least one intermediate transition layers, the transition layers forming a transition region, the transition region disposed above the first layer, the transition region having a vertical thickness T, and where at least one of the transition layers has lattice constants between $L_1$ and a second lattice constant $L_2$ where the first transition layer has a lattice constant closer to the $L_1$ than $L_2$ and the last transition layer has a lattice constant closer to the $L_2$ than $L_1$; and a second layer disposed on the transition region, the second layer having the second lattice constant $L_2$; wherein: the transition region has an average fractional change in lattice constant characterized by κ where $\kappa=(D/T)\{(L_2-L_1)/L_1\}$, where $0<|\kappa|\leq 10$ and where $D \geq 2$ μm.

According to another broad aspect of the invention, there is provided a semiconductor structure, the semiconductor structure comprising: a first layer, the first layer having a restricted growth surface having a transverse dimension D, the first layer having a first lattice constant $L_1$; a first, last and at least one intermediate transition layers, the transition layers forming a transition region, the transition region disposed above the first layer, the transition region having a vertical thickness T, and where at least one of the transition layers has lattice constants between $L_1$ and a second lattice constant $L_2$ where the first transition layer has a lattice constant closer to the $L_1$ than $L_2$ and the last transition layer has a lattice constant closer to the $L_2$ than $L_1$; and a second layer disposed on the transition region, the second layer having the second lattice constant $L_2$; wherein: the transition region has an average fractional change in lattice characterized by κ where $\kappa=(D/T)\{(L_2-L_1)/L_1\}$, where $0<|\kappa|\leq 10$.

According to another broad aspect of the invention, there is provided a semiconductor structure grown on a substrate having a transverse dimension $\geq 21$ mm, the semiconductor structure comprising: a first layer, the first layer having a restricted growth surface having a transverse dimension D, the first layer having a first lattice constant $L_1$; a first, last and at least one intermediate transition layers, the transition layers forming a transition region, the transition region disposed above the first layer, the transition region having a vertical thickness T, and where at least one of the transition layers has lattice constants between $L_1$ and a second lattice constant $L_2$, where the first transition layer has a lattice constant closer to the $L_1$ than $L_2$ and the last transition layer has a lattice constant closer to the $L_2$ than $L_1$; and a second layer disposed on the transition layer, the second layer a second lattice constant $L_2$; wherein: the second layer has a transverse dimension $D_2$, where $D_2=D+D\{(L_2-L_1)/L_1\}$.

According to another broad aspect of the invention, there is provided a semiconductor structure grown on a substrate having a transverse dimension $\geq 21$ mm, the semiconductor structure comprising: a first layer, the first layer having a restricted growth surface having a transverse dimension D, the first layer having a first lattice constant $L_1$; a first, last and at least one intermediate transition layers, the transition layers forming a transition region, the transition region disposed above the first layer, the transition region having a vertical thickness T, and where at least one of the transition layers has lattice constants between $L_1$ and a second lattice constant $L_2$, where the first transition layer has a lattice constant closer to the $L_1$ than $L_2$ and the last transition layer has a lattice constant closer to the $L_2$ than $L_1$; and a second layer disposed on the transition region, the second layer having the second lattice constant $L_2$; wherein: the transition region having an average fractional change in lattice constant characterized by κ where $\kappa=(D/T)\{(L_2-L_1)/L_1\}$, where $D \geq 1$ μm and the lattice mismatch between $L_1$ and $L_2$ is defined by $(L_2-L_1)/L_1$ and is $\geq 2.5 \times 10^{-2}$ and $0<|\kappa|\leq 100$.

According to another broad aspect of the invention, there is provided a semiconductor structure grown on a substrate having a transverse dimension $\geq 21$ mm, the semiconductor structure comprising: a first layer, the first layer having a restricted growth surface having a transverse dimension D, the first layer having a first lattice constant $L_1$; a first, last and at least one intermediate transition layers, the transition layers forming a transition region, the transition region disposed above the first layer, the transition region having a vertical thickness T, and where at least one of the transition layers has lattice constants between $L_1$ and a second lattice constant $L_2$, where the first transition layer has a lattice constant closer to the $L_1$ than $L_2$ and the last transition layer has a lattice constant closer to the $L_2$ than $L_1$; and a second layer disposed on the transition region, the second layer having the second lattice constant $L_2$; wherein: the second layer has a thickness $\geq 1.2CT$, where:

$$CT=(0.4374/f)[ln(CT/4)+1],$$

where f is an average lattice mismatch of the second layer normalized to a lattice constant of the substrate; and the transition region having an average fractional change in lattice constant characterized by κ where $\kappa=(D/T)\{(L_2-L_1)/L_1\}$, where the lattice mismatch is defined by $\{(L_2-L_1)/L_1\}$, and where both D and the lattice mismatch are selected from region to the right of and including a line defined by Log $D \geq -3.5$ Log $\{(L_2-L_1))/L_1\}-6$, where D is measured in μm.

Other objects and features of the present invention will be apparent from the following detailed description of the preferred embodiment.

BRIEF DESCRIPTION OF THE DRAWINGS

The invention will be described in conjunction with the accompanying drawings, in which:

FIGS. 2a through 2d illustrate techniques for growing an arbitrarily thick layer of lattice mismatched material without the generation of misfit dislocations in accordance with a preferred embodiment of the invention;

FIG. 4b is an exploded view of the active region of FIG. 4a;

FIG. 5b is an exploded view of the active region of FIG. 5a.

DETAILED DESCRIPTION OF THE PREFERRED EMBODIMENT

Figure 1A:
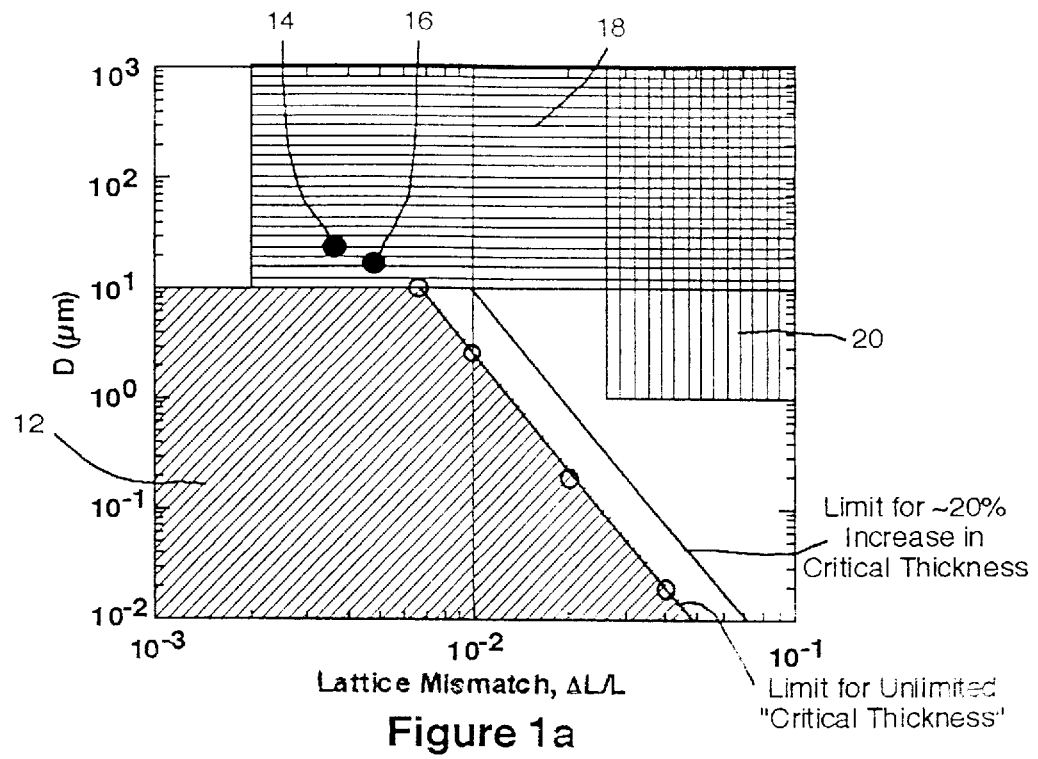
FIG. 1a is a graph of Lattice Mismatch v. D for a variety prior art devices as well as the inventive devices constructed in accordance with a preferred embodiment of the invention.

It is advantageous to define several terms before describing the invention. It should be appreciated that the following definitions are used throughout this application.

The term "GaAs" refers to a semiconductor composition which may be used as a substrate. Nominally, the prototypical III–V binary semiconductor material consisting of equal parts of the two elements Ga and As are used to form the semiconductor material. It should be appreciated that some deviations, to meet device needs or unwanted impurities, may be permitted which continue to use established GaAs fabrication procedures. To permit for anticipated need for impurities or other relatively insignificant modifications, it is prescribed that both Ga and As are present and combine to form an amount of at least 95% of the substrate's entire composition. GaAs has a lattice constant of about 5.65 Å. Additionally, it should be appreciated that the term "substrate" may include any material underneath the active layer. For example, mirror layers, waveguide layers cladding layers or any other layer underneath the active layer.

The term "InGaAs" refers to a semiconductor material comprising at least In, Ga, and As in any concentrations with respect to each other.

The term "Critical Thickness" discussed in greater detail below, is generally referred to as the critical thickness based on the criteria developed by Matthews and Blakeslee. For a detailed discussion of Critical Thickness, the reader is referred to the article entitled "Defects in Epitaxial Multilayers: I Misfit Dislocations," published in the Journal of Crystal Growth, vol. 27, pp. 118–125 (1974) and to James Coleman's book, entitled *Quantum Well Lasers*, published by Academic Press, London, (1993) pp. 372–413. For materials epitaxially grown on large-area (100) oriented GaAs and in the absence of strain compensation, the value of critical thickness may be determined by the following formula:

$$CT = (0.4374/f)[\ln(Ct/4)+1] \qquad (1)$$

where f is the lattice mismatch normalized to the GaAs lattice constant, or more commonly referred to as strain. The strain may be determined by the portion of In or other elements present in the InGaAs semiconductor material. For example, for $In_yGa_{1-y}As$ on GaAs, f equals 0.07164 multiplied by y, where y varies between 0.0 and 1.0. Generally, the CT is measured in Å and varies between 71.9 Å and 13.6 Å for $In_yGa_{1-y}As$ where y varies between 0.33 and 1.0.

For a strained $In_yGa_{1-y}As$ semiconductor material on a InP substrate, the equivalent expression is:

$$Ct = (0.454/f)[\ln(CT/4.15)+1] \qquad (2)$$

where f is the lattice mismatch normalized to the InP lattice constant, or more commonly referred to as strain. This expression is for materials epitaxially grown on (100) oriented InP and in the absence of strain compensation. The strain may be determined by the portion of In or other elements present in the InGaAs semiconductor material. For example, for $In_yGa_{1-y}As$ on InP, f equals $0.032368 \times [(y-0.53)/0.47]$, where y varies between 0.0 and 1.0. When y=0.53, the $In_yGa_{1-y}As$ is lattice matched to InP. Henceforth, the term CT on nominal GaAs or In P substrates shall refer to the solution of equation (1) or (2), respectively. The term CT may also apply to the solution of equations equivalent to (1) and (2) for materials grown on other substrates. It should be appreciated that the term "Critical Thickness" is more general, but less precisely defined.

Additionally, it should be appreciated that the CT's as defined in equations (1) and (2) are valid for strained-layer structures on a thick substrate and having a sufficiently thick overlayer(s) of unstrained material grown on top. This is the structure used for most device applications. As described by Matthews & Blakeslee, absence of the thick substrate results in a doubling of the critical thickness, while absence of the overlayer halves the critical thickness. Vawter et al., in an article entitled "Useful Design Relationships for the Engineering of Thermodynamically Stable Strained-layer Structures," Journal of Applied Physics, vol. 65, pp. 4769–4773, 1989, discusses the minimum required thickness of the overlayer(s).

In this context, the term "pseudomorphic" is used to describe a semiconductor material which is substantially free of misfit or threading dislocations and being constrained to the lattice constant of the substrate in the transverse direction, ie., horizontal direction. Generally, for the purposes of this application, well-grown semiconductor layers which have a thickness below their respective CTs will be pseudomorphic. Additionally, by utilizing the teachings, one may construct a pseudomorphic semiconductor material which is above its respective critical thickness while maintaining the level of misfit dislocations which would be present if the semiconductor material had a thickness below the CT. In the context of this application, "pseudomorphic" may also refer to selected regions. For example, the central region of a growth area may be pseudomorphic whereas the outer portions may contain misfit dislocations. This concept is discussed in greater detail below.

Before continuing with the definitions of certain terms, it is essential to explain how dislocations may be detected. In order to test for dislocations, a number of techniques are know in the semiconductor art. For example, Gourley et al., describes the use of photoluminescence microscopy (PLM) to detect "dark lines" which result from dislocations. The Gourley et al. article is hereby incorporated by reference. In fact, Gourley used PLM to determine whether or not a strained layer was grown above its critical thickness. PLM may be used directly and nondestructively on VCSELs. Since EELs usually have a metallic contact over the active region, the contact must be removed in order to test the active region. Alternatively, for VCSELs or EELs, the device may be removed from its package, allowing optical access from the bottom of the device. Since both GaAs and InP substrates are fairly transparent to wavelengths over 1 $\mu$m, there is no need to remove the substrate. The presence of a single dark line is a VCSEL or EEL device is sufficient to determine that the device is not pseudomorphic.

Other techniques are available and are known in the semiconductor art. Electron beam induced current (EBIC) is another test which is nondestructive for VCSELs. EBIC detects dislocations in the active region. As with PLM, a single dislocation detected by EBIC is sufficient to determine that the structure is not pseudomorphic. High resolution electron microscopy (HREM) allows sufficiently high magnification to observe atomic dislocations as described by Fang & Morkoc, which is entitled "Integrated Optoelectronics," Academic Press, pp. 170–173, 1995. It should be appreciated that under long-term or high-stress operation, "dark lines" or dislocations will develop in any semiconductor lasers or LEDs. For the purposes of this discussion, it is assumed that the testing for dislocations is performed under conditions in which the device has undergone normal operation for 1,000 hours or less.

This application makes a distinction between the nominal lattice constant, i.e., the lattice constant the material would have in a bulk crystal form, and the grown lattice constant, i.e., the lattice constant the material takes on when grown on a given structure. For example, a monolayer of InAs grown pseudomorphically on GaAs and overlaid with GaAs will assume the same horizontal grown lattice constant as GaAs, even though the nominal lattice constant of InAs is about 7% larger than that of GaAs. It is also important to note that the grown lattice constant may change after its deposition, depending upon the material grown over it. Even the GaAs on the pre-growth mesa may expand slightly after growth of strained material and therefore have a grown lattice constant different from normal GaAs. Hereinafter, the grown lattice constant will refer to its final value after all layers are grown.

Reference has been made to a lateral dimension D. For devices, e.g., lasers, D is defined as the maximum lateral dimension in the active region through which, during normal operation, electrical current flows with a current density of at least 25A/cm$^2$. For VCSELs, D is usually the maximum lateral dimension of the current confining structure, if present. If there is no current confining structure, the general definition for D would apply. Examples of current confining structures include, but are not limited to, an oxide-defined aperture or an implantation-defined aperture. For EELs, D is usually equal to its length.

All concentrations for chemical elements are provided in ratios which range from 0.0 to 1.0, where 1.0 corresponds to 100% of that element. It should also be appreciated that when we discuss an element in a group III or V semiconductor material, the ratio applies to the concentration of the elements in either the group III or group V materials and not the entire semiconductor material. For example, an In concentration of 0.5 would correspond to 50% In concentration of the group III material used to construct the semiconductor material and not to 50% of the entire semiconductor material. This scheme is used throughout the application unless specifically enumerated. It should be appreciated that other group elements such as I, II, IV, VI, VII, VIII, transition, or rare-earth elements, in small quantities, may also be utilized in conjunction with the group III/V materials.

A technique and structure is now described which may allow the growth of arbitrarily thick layers of lattice-mismatched material without the generation of misfit dislocations. The general area of interest may be seen in FIGS. 1$a$ and 1$b$. The area of general device interest for the inventive devices would include, but is not limited to, shaded regions 18 and 20. The area corresponding to materials grown directly on GaAs substrates and having emission wavelengths of 1.3 $\mu$m or greater on a GaAs substrate is illustrated by shaded region 20 and 20', respectively. As may be seen in FIG. 1$a$, region 18 corresponds to a lattice mismatch between $2\times10^{-3}$ and $1\times10^{-1}$ and a D greater than or equal to 10 $\mu$m. Similarly, region 20 corresponds to a lattice mismatch between $2.5\times10^{-2}$ and $1\times10^{-1}$ and a D greater than or equal to 1 $\mu$m. As may be seen in FIG. 1$b$, regions 18' and 20' are bounded at one end by $\kappa$ less than or equal to 10. In the D/T axis of FIG. 1$b$, the quantity T is the thickness of a region having a gradient in lattice constant, as discussed below. For convenience, FIG. 1$a$ has upper and right boundaries established at $10^3$ and $10^{-1}$. It should be appreciated that FIG. 1$a$ is merely illustrative and the inventive concept contemplates regions greater than these illustrated boundaries. In a similar manner, the lower boundary for D/T is illustrated as $10^0$.

FIG. 1$b$ also provides information as to prior art devices. For example, filled circle 22 corresponds to data by Matthews & Blakeslee III and filled circle 24 corresponds to data by Chin & Tu.

J. C. P. Chang et al. in a publication entitled "Strain Relaxation of Compositionally Graded InXGal-XAs Buffer Layers for Modulation-Doped In$_{0.3}$Ga$_{0.7}$As/In$_{0.29}$Al$_{0.71}$As Heterostructures," *Applied Physics Letters*, vol. 60, March 1992, pp. 1129–1131, disclose the use of a step-graded region of 3 InGaAs layers grown on GaAs. Each layer is 3000 Å thick and increases the In concentration by 10%. The layers comprise InGaAs with 10%, 20% and 30% In. The material grown on top of this transition region has only 29% In. Thus the thickness T of the region transitioning from 0% to 30% Indium is 0.6 $\mu$m, i.e. only 2 of the layers accomplish the transition. The change in lattice constant is $\Delta L/L = 0.0215$. Assuming a substrate diameter of 2" (50 mm), D/T=83,333. Thus for this structure, $\kappa$=1,792. This data is plotted as filled circle 23 in FIG. 1$b$.

L. J. Stinson et al. in a publication entitled "High-Efficiency InGaP Light-Emitting Diodes on GaP Substrates," *Applied Physics Letters*, vol. 58, May 1991, pp. 2012–2014, disclose the use of a thick graded region of InGaP grown on GaP. The parameters are not precisely specified, but an order-of-magnitude estimate may be obtained. A reference to the article states the graded region thickness as 10 $\mu$m, which is consistent with FIG. 1 on Stinson's publication. The materials grown on top of this graded region in various structures had photoluminescence peak wavelengths all larger than 550 nm. This requires a lattice mismatch $\Delta L/L > 0.023$. Assuming a substrate diameter of 2" (50 mm), D/T=5,000. Thus for this structure, $\kappa$=115, which is considered to be an overestimate of the minimum value of $\kappa$ for this work. This data is plotted as filled circle 25 in FIG. 1$b$ G. C. Osbourn et al. in a publication entitled "A GaAs$_x$P$_{1-x}$/GaP Strained-Layer Superlattice," *Applied Physics Letters*, vol. 41, July 1982, pp. 172–174, disclose the use of a graded region of InGaP grown on GaP. The graded region thickness is T=1.5 $\mu$m. The grade is to 20% In, producing $\Delta L/L = 0.0075$. Assuming a substrate diameter of 2" (50 mm), D/T=33,333. Thus for this structure, $\kappa$=250. This data is plotted as filled circle 15 in FIG. 1$b$.

T. P. Chin et al. in a publication entitled "Gas-Source Molecular Beam Epitaxial Growth, Characterization, and Light-Emitting Diode Application of $In_xGa_{1-x}P$ on GaP(100)," [*Applied Physics Letters*, vol. 62, May 1993, pp. 2369–2371, disclose the use of a graded region of InGaP grown on GaP. The graded region thickness is T=1.2 μm. The grade is to 32% In, producing ΔL/L=0.012. Assuming a substrate diameter of 2" (50 mm), D/T=41,667. Thus for this structure, κ=500. This data is plotted as filled circle 17 in FIG. 1*b*.

E. A. Fitzgerald et al. in a publication entitled "Totally Relaxed $Ge_xSi_{1-x}$ Layers with Low Threading Dislocation Densities Grown on Si Substrates," *Applied Physics Letters*, vol. 59, August 1991, pp. 811–814, disclose the use of a graded region of GeSi grown on Si. The graded region is specified to have a gradient in Ge concentration of 10%/μm. Thus ΔL/(LT)=0.004/μm. The grade proceeds up to Ge concentrations as high as 53%. For plotting convenience, this data is plotted for a Ge concentration of 50%. Thus the thickness T=5 μm and the lattice mismatch is ΔL/L=0.02. Assuming a substrate diameter of 2" (50 mm), D/T=10,000. Thus for this structure, κ=200. This data is plotted as filled circle 19 in FIG. 1*b*.

P. Ribas et al. in a publication entitled "Device Quality $In_{0.4}Ga_{0.5}As$ Grown on GaAs by Molecular Beam Epitaxy," *Applied Physics Letters*, vol. 57, September 1990, pp. 1040–1042, disclose the use of a step-graded region of InGaAs grown on GaAs. The region in which the lattice constant is increasing has a thickness of T=0.599 μm. The grade is to 43% In, producing ΔL/L=0.031. Assuming a substrate diameter of 2" (50 mm), D/T=83,472. Thus for this structure, κ=2,587. This data is plotted as filled circle 21 in FIG. 1*b*.

F. K. LeGoues et al. in a publication entitled "Mechanism and Conditions for Anomalous Strain Relaxation In Graded Thin Films and Superlattices," *Journal of Applied Physics*, vol. 71, May 1992, pp. 4230–4243, disclose the use of graded regions of SiGe grown on Si and of InGaAs grown on GaAs. The most gradual grade in the InGaAs growth was over a thickness T=1 μm as determined from FIG. 15*c* of the publication. This grade attained an In concentration of 40% for a lattice mismatch ΔL/L=0.0286. Assuming a substrate diameter of 2" (50 mm), D/T=50,000. Thus for this structure, κ=1,430. This data is plotted as filled circle 13 in FIG. 1*b*.

Figure 1B:
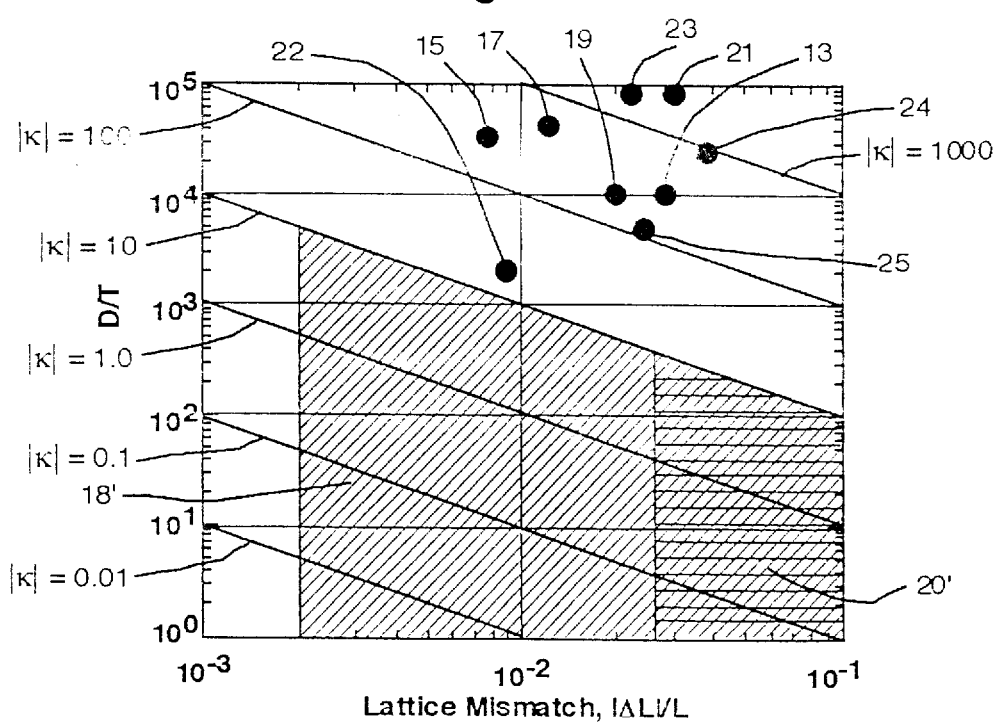
FIG. 1b is a graph of Lattice Mismatch v. D/T and showing several values of κ for a variety prior art devices as well as the inventive devices constructed in accordance with a preferred embodiment of the invention.

As may be seen, there is no overlap between the inventive regions and the known prior art. The prior art attempts to use graded layers fail to produce a defect-free transition region because the gradients used are far too high. As will be seen in the following analysis and illustrations, defect-free transition regions may be produced when they are described by a value of |κ| which is on the order of unity. As seen in FIG. 1*b*, all prior art descriptions of graded regions have values of |κ| which are well above 10, when calculated for 2-inch diameter substrates. The lowest value for |κ| in FIG. 1*b* is 18. Even if this structure were to be grown on a tiny 21 mm diameter substrate, the value for |κ| would be >7.5. All the other references have |κ|>100 for 2-inch substrates.

The basis of the technique is illustrated in FIG. 2*a*. Starting from the bottom, epitaxial growth is performed on a restricted area, e.g., a mesa 26. Mesa 26 may be formed by etching away the surrounding substrate material and may be, for example, circular, rectangular, square, cloverleaf or any other shape. It should be appreciated that the restricted area may be generated by utilizing a mask in the epitaxial growth process instead of etching the substrate. For example, a layer of patterned silicon nitride, ~300 Å or thicker, inhibits growth by MOCVD. Alternatively, a heavy ion implantation in selected regions may inhibit crystalline growth, thereby inhibiting the accumulation of stress forces. A typical mesa 26 would have transverse dimension D which may be greater than or equal to 10 μm and a height of at least 0.05 μm. It should be appreciated that the transverse dimension D, as discussed above, may encompass the entire mesa 26 or may only corresponds to a central region 32. In all cases, D is defined as the maximum lateral dimension in the active region through which, during normal operation, electrical current flows with a current density of at least $25A/cm^2$. The height of mesa 26 must be sufficiently large, compared to a transition region 28, discussed below.

The transverse dimension D is additionally significant because threading dislocations may propagate laterally over large distances during growth, even a low density of threading dislocations in the substrate may cause a high density of misfit dislocations in the grown material. When mesa 26 is sufficiently small such that there is a statistical improbability of having a threading dislocation on a surface of mesa 26, then there will be no mechanism for threading dislocations to generate misfit dislocations. Furthermore, the lateral propagation of threading dislocations in the substrate does not occur at the interfaces of mesa 26. This effect in itself does not increase the theoretical critical thickness, but it helps attain it in a practical imperfect environment. It should be appreciated that while we have referred to the restricted growth surface as a mesa, it may also be an etched recess or a surface defined by pattern disorienting.

Next, transition region 28 is grown directly on mesa 26. It should be appreciated that there may be intermediate material between the top of mesa 26 and transition region 28 so long as this intermediate material has a lattice constant which is within 0.1% of that of the mesa region 26. Otherwise the "intermediate" material may be part of transition region 28. Additionally, material may be grown on a substrate prior to the formation of mesa 26.

In FIG. 2*a*, the last 4 atomic periods are shown for material at the substrate lattice constant, for example, growth of 4 monolayers of GaAs or AlGaAs on a mesa 26 formed on a GaAs substrate. It should be appreciated that these monolayers are an integral part of mesa 26. For clarity, the lower part of mesa 26 is not illustrated. Additionally, it should be appreciated that additional material may be grown for increasing the height of mesa 26. Transition region 28 is then grown in which the lattice constant of the grown material gradually varies. In the example of FIG. 2*a*, the lattice constant increases, but it could decrease just as well. One may tell that the lattice constant is increasing since transition region 28 gradually tapers outwardly as transition region 28 is grown. It should be appreciated that the figures illustrate a graded transition region. It is possible to have layers in the transition region which do not correspond to a gradually graded region and in fact may have a lattice constant which is greater or less than either the substrate or new lattice constant region, discussed below.

The transition region effectively re-defines the lattice constant at which strain-free material may be grown. At the top of transition region 28, material 30 of a new lattice constant may be grown to arbitrarily-large thicknesses without misfit dislocations, as long as the new lattice constant is reasonably close to that of the top of the transition region or if it is sufficiently thin, i.e., it must be below its respective Critical Thickness. In FIG. 2*a*, the last layer of material having the substrate lattice constant and the first layer of the new lattice constant may both be considered to be part of transition region 28.

As may be seen by comparing FIGS. 2a and 2b, the edges of the transition regions may vary considerably without affecting central portions 32 of the transition and new-lattice-constant regions. For small total changes in lattice constant, e.g. <10% and κ≈1 as defined below, the change in mesa diameter will usually be less than about 10%.

Transition region 28 is now described in detail. The key aspect of transition region 28 is that the lattice constant variation parameter, κ, is kept below a "maximum" value which is determined solely by the lateral dimension of the growth area D and scaled by the substrate lattice constant. In FIG. 2a, 2b, 2c, 2d 3a, and 3b, the Group-III atoms are shown as shaded circles and the group V atoms are shown as open circles. This discussion refers to numbers of Group-III atoms only and uses growth upon mesa 26 as the example. Mesa 26 is illustrated as 10 atoms wide for better visualization, but the discussion is generally valid for mesas n atoms wide where n may typically be 50,000 or more atoms. Given a mesa width of n atoms, then a monolayer of material may be grown with misfit of dislocations, so long as the grown material has a lattice constant differing from the substrate lattice constant by a sufficiently small amount, for example, on the order of 1/n. In a 10 atom wide mesa, the lattice constant may be different by 1/10, or 10% but in a more practically-sized mesa, the difference is exceedingly small. As discussed above, it is important to distinguish between the nominal lattice constant and the grown lattice constant. Hereinafter, the grown lattice constant will refer to its final value after all layers are grown.

Following the growth of a layer with a grown lattice constant of $[1+(1/n)]$ times the substrate lattice constant, another layer may be grown, also without misfit dislocations, by increasing the grown lattice constant by the same factor. Thus the second layer has a grown lattice constant of $[1+(1/n)]^2$. In FIG. 2a, the first two layers of the transition region increase the grown lattice constant above the substrate lattice constant by a factor of $(11/10)^2$. In general with such a construction, m atomic layers of a transition region may transition from a lattice constant $L_1$ to a new lattice constant $(L+\Delta L)$ by:

$$[1+(1/n)]^m = 1+\Delta L/L \quad (3)$$

or more generally $$[1+(\kappa/n)]^m = 1+\Delta L/L \quad (4)$$

where κ may be positive or negative. The example in the preceding paragraph is for κ=+1, as is the illustration of FIG. 2a. In a preferred embodiment, the magnitude of ΔL/L will be greater than 0.001. For very large |κ|, misfit dislocations become highly probable, especially in the outer regions of mesa 26. These misfit dislocations may not present a problem in an operational device so long as they reside outside of the lateral dimension D on mesa 26. FIG. 2c shows a transition region with κ=+2.0. FIG. 2d shows a transition region where κ=+0.5. The low |κ| decreases the likelihood of creating misfit dislocations, but it requires a thicker transition region 28. Additionally, the larger the |κ| the greater the magnitude of taper for transition region 28. The condition κ=0 describes lattice-matched growth. Unless it forms part of a transition region, it is not considered as an inventive concept for this application because it does not achieve any change in grown lattice constant. It is also possible to have κ vary within a transition region. A transition region may also comprise materials having any nominal lattice constant, including for example a layer of GaAsP in a transition region which grades from the GaAs lattice constant to a larger lattice constant. When κ is negative, ΔL will also be negative and vice-versa. Unless otherwise stated, κ is assumed to be +1.0 in all of the following discussions.

The rate of variation in grown lattice constant specified by equation (4) is far smaller than in previous reports of graded-lattice-constant materials. The thickness, T, of the transition region required to transition from one lattice constant, $L_1$ to another given by $(L+|\Delta L|)$ is given by the number of monolayers of atoms required for the transition, m, multiplied by the average atomic monolayer spacing in the vertical direction $a_v$. From equation (3), m is easily calculated, yielding T:

$$ma_v = T = a_v \ln[(|\Delta L|/L) - \kappa/n)] \quad (6)$$

Since ΔL/L and κ/n are both <<1 for essentially all cases of interest, a linear approximation for the logarithmic function is valid. Thus:

$$T \approx a_v(n/\kappa)(|\Delta L|/L) \quad (7)$$

In most cases, e.g., the (001) oriented lattice illustrated in FIG. 2, the vertical atomic spacing equals the horizontal atomic spacing which determines the number of atoms, n, across mesa 26. Therefore, in these cases, the product of $a_v$ n is the average mesa diameter. Since the mesa diameter does not change significantly for reasonable changes in lattice constant a good and useful approximation is to use the original mesa diameter as D. Finally:

$$T \approx D(|\Delta L|/\kappa L) \quad (8)$$

It should be appreciated that a change of 7% or greater represents a large change in lattice constant. In a preferred embodiment, T is >30 Å and D is ≧5 μm. Hereinafter, equation (8) will be used to relate and establish the quantities contained therein. Therefore, κ is hereinafter defined as:

$$\kappa = (D/T)(\Delta L/L) \quad (9)$$

Substrate orientation does have an effect on the inventive concept. The lattice constant and the atomic spacing are not the same, but the normalized changes will be the same, i.e. a 1% change in lattice constant will produce a 1% change in atomic spacing. While the lattice constant is independent of the lattice orientation, the atomic spacing does depend on lattice orientation. For certain substrate orientations, the horizontal and vertical atomic spacings will be different than for the (001) orientation illustrated in FIGS. 2a through 2d. For example, a (110) orientation, at a 45% angle in FIGS. 2a through 2d, has the horizontal atomic spacing reduced by the square root of two (1.414) compared to the (001) orientation, assuming both the Ga and As atoms are counted. Thus the number of atoms across a given-sized mesa is increased by 1.414 and the change in grown lattice constant per monolayer is similarly reduced. However, the vertical atomic spacing is also reduced by 1.414. Thus 1.414 times more monolayers are required in the transition region, but each layer is 1.414 time thinner. The transition region therefore has the same thickness and the gradient in lattice constant with respect to thickness has the same value in either orientation. Equation (8) is independent of substrate orientation so long as the horizontal and vertical atomic spacings are the same. In a preferred embodiment, the substrate will have an orientation of between 0° and 4° off the (001).

Figure 4A:
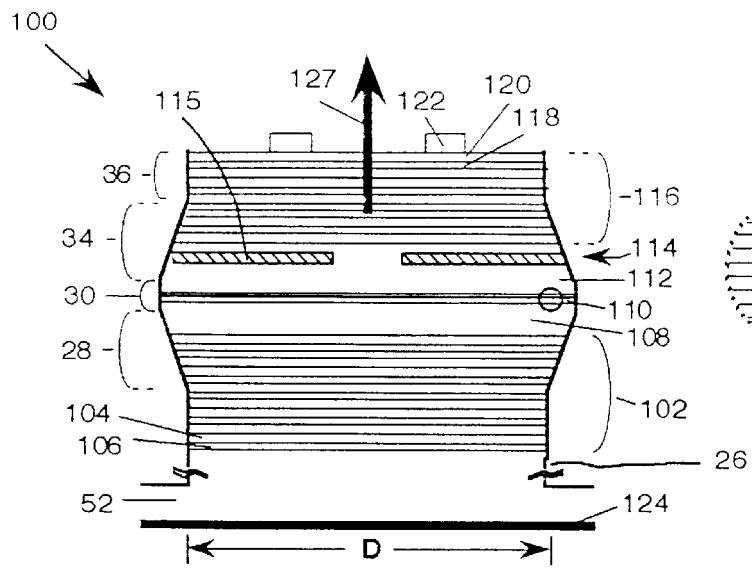
FIG. 4a is cross section of a VCSEL which incorporates the substrate and active region of FIGS. 2a through 2d, 3a and 3b.

For the nominal case, |κ|=1.0, the thickness of transition region 28 is just the diameter D of mesa 26 (or for example maximum dimension of an active region) multiplied by the fractional change in lattice constant. To achieve a modest change in lattice constant of 1% on a 2" (D=50 mm) diameter substrate would require a transition region whose thickness is 1% of the substrate diameter, i.e., T=0.5 mm. To our knowledge this thickness is not predicted and certainly not with a gradient. Matthews & Blakeslee report growth achieving a $|\Delta L|/L=0.9\%$ change in lattice constant by grading over a thickness of 25 µm. For a 2 inch substrate (D=50 nm), this implies a $\kappa=18$. This data is plotted in FIG. 1b as point 22. However, a 1% change of lattice constant with $|\kappa|=1.0$ on a D=25 µm diameter mesa 26 requires only a 0.25 µm thick transition region 28. This thickness is practical and easily achieved by MBE, MOVPE, or any other widely-used epitaxial process. A D=25 µm diameter mesa 26 is sufficient for growth and fabrication of VCSELs as demonstrated, for other purposes, by Koyama et al. in IEEE Photonics Technology Letters, vol. 7, pp. 10–12 (1995). An illustration of a VCSEL constructed in accordance with the invention is illustrated in FIG. 4a. Chin et al. reported a graded layer 2 µm thick in which the lattice constant changes by 3.8%. For a 2-inch (50 mm) diameter substrate, this implies D/T=2.5 $10^4$ and $\kappa=950$. This defines point 24 in FIG. 1b.

Figure 5A:
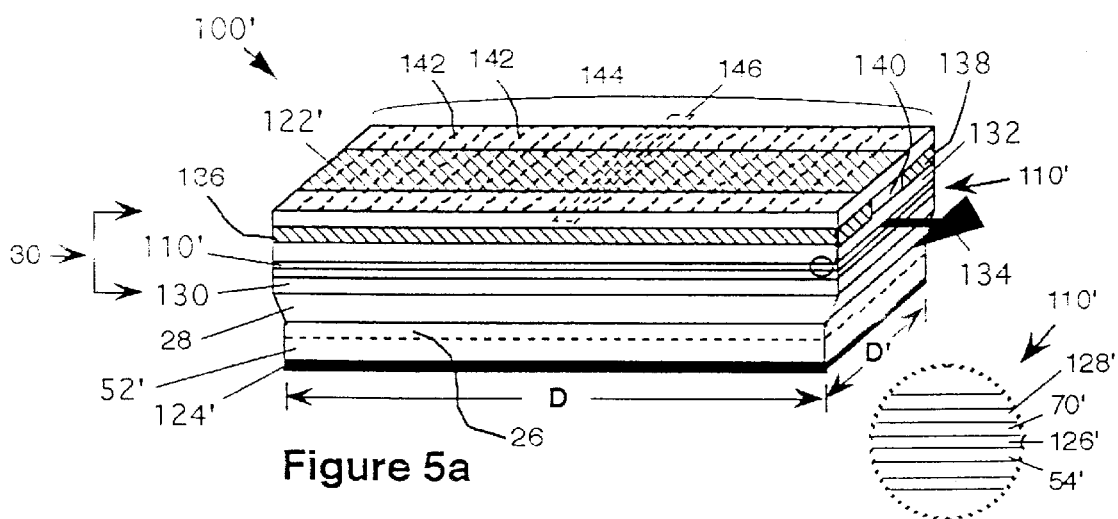
FIG. 5a is a cross section of an in-plane emitter which incorporates the substrate and active region of FIGS. 2a through 2d, 3a and 3b.

For edge-emitting lasers, a length of D=250 µm or more is appropriate, implying a transition region 28 about 2.5 µm thick for $|\kappa|=1.0$. Such a thickness is still easily attainable, especially considering that much of the laser structure may be integrated into transition region 28 as illustrated in FIG. 5a.

As previously mentioned, the grown lattice constant gradient in the transition region is extremely small. A 25 µm mesa of GaAs has about 88,500 Ga or As atoms across it. Thus, for $|\kappa|=1$, the first monolayer should mismatch from the GaAs lattice constant by $1.13\times10^{-5}$, and therefore would contain an In concentration of 0.000158, i.e. less than two hundredths of a percent. The structures reported by Fitzgerald et al on the same diameter mesas have an abrupt change in In concentration of 0.0036, i.e. more than 22 times higher. Larger dimension structures with $|\kappa|=1$ would have even smaller average lattice constant gradients. It should be appreciated that InAs has a 7.0164% larger lattice constant than GaAs. The grown lattice constant in transition region 28 is optimally an exponential as described by equation (5). However, the linear approximations made for equations (7) and (8) are reasonably accurate and are most useful for estimating thicknesses and gaining better understanding of the structures. With the linear approximation and the 25 µm GaAs mesa 26, the In concentration increases by 0.000158 in each succeeding monolayer for $\kappa=1.0$. While such control may be possible in advanced epitaxial reactors, it may be preferable to perform the growth in a simpler manner, for example in steps much larger than one monolayer but which are still sufficiently small as to not incur misfit dislocations. The In concentration changes by 1% about every 63 monolayers, or 178 Å. Thus a 1% In layer ($In_{0.01}Ga_{0.94a}S$) 178 Å thick may be grown, followed by a 2% In layer of the same thickness, followed by a 3% layer, and so on. Numerous variations on this approach may be employed, for example modifying the concentrations and/or thicknesses to better approximate the optimal exponential form. Furthermore, it is not necessary to have monoatomic variation in the nominal or grown lattice constant. In a preferred embodiment, each layer may be grown below its respective critical thickness as calculated based upon the layer's nominal lattice constant and the grown lattice constant of the immediately underlying material.

Transition region 28, as described, only requires an average variation in grown lattice constant. Therefore, it should be appreciated the first few or last few layers forming transition region 28 may have lattice constants which are not consistent with the overall average variation of transition region 28. It is preferable for the first layer of transition region 28 to have a lattice constant close to that of mesa 26. But, it should be understood that this first layer or first few layers may have a lattice constant similar to the new lattice constant material 30 so long as this/these layer(s) does/do not effect the overall average variation in grown lattice constant in the transition region 28 to any great extent. Similarly, the last layer or layers of transition region 28, may have a lattice constant similar to mesa 26, instead of new lattice constant material 30. Similarly, any small regions within transition region 28 may have nominal lattice constants inconsistent with the overall grading of region 28. For example, having a lattice constant outside of the range of mesa 26 and new lattice constant material 30.

Other material variations which are normal parts of lasers may be straightforwardly integrated into transition region 28. Furthermore, strained layers (compressive and/or tensile) may be incorporated into transition region 28 and/or the new lattice constant region 30. For example, the primary envisioned use of this technique is to achieve, via highly-mismatched growth, extended wavelength laser operation on GaAs or on InP substrates. For this use, it is only the active region which requires the highly-mismatched material, and the active region is typically only about 50–1000 Å thick. For a detailed discussion on the use of strain compensation to increase critical thickness, see U.S application Ser. 08/08/721,589 entitled "Extended Wavelength Strained Layer Lasers Having Strain Compensated Layers," filed Sep. 25, 1996. This application is hereby incorporated by reference.

A very specific example of how prior art teaching may be used in combination the invention is now presented. Ishikawa has proposed in IEEE Photonics Technology Letters, vol. 6, pp. 344–347, 1994, the use of ternary substrates of $In_{0.26}Ga_{0.74}As$ for producing 1.3 µm lasers with superior temperature characteristics. Ternary substrates are the subject of research activities, but are not generally available in large quantity or size or at low cost. The inventive technique described herein may be used to produce equivalent lasers on GaAs substrates. The top of the transition region may be considered to be a "micro-substrate" on which device structures may be grown. To mimic the laser proposed by Ishikawa, transition region 28 should end with the lattice constant of $In_{0.26}Ga_{0.74}As$. Since it differs from that of GaAs by about 1.8%, a 250 µm long mesa 26 requires a transition region 28 about 4.5 µm thick for $\kappa=1.0$. Ishikawa's laser structure may be grown on top of this "micro-substrate." The total growth time and thickness may be favorably reduced however by integrating all or much of the bottom part of the laser structure into transition region 28. Here, the "bottom" part refers to the part of the laser below the active region, see FIGS. 4a and 5a. Thus, while maintaining a grown lattice constant variation in accordance with equation (5), the actual materials may vary, e.g. between InGaAs and InAlGaAs to optimize carrier confinement. The active region and succeeding material may be grown following the Ishikawa design or any other semiconductor laser design known in the prior art. Some differences may still remain between the inventive structure and that proposed by Ishikawa. The exact composition of the active layers may need to be different in order to achieve the same emission wavelength or the same amount of compressive strain. This is an inconsequential difference and is a mere matter of design choice. Numerous variations on this design are within the scope of the present invention.

A VCSEL having an active region similar to that proposed by Ishikawa may also be formed. On a 25 $\mu$m mesa 26, a 0.45 $\mu$m thick transition region 28 could be grown ($\kappa$=1.0), followed by the VCSEL structure having ternary InGaAs mirrors. Since the transition region is not very thick, the bottom mirror could comprise instead, for example, GaAs/ AlAs layers throughout its structure. Following the bottom mirror, a 0.45 $\mu$m thick transition region 28 to In$_{0.26}$(AlGa)$_{0.74}$As with appropriate confinement structure could be grown. An active region is then grown. The active region would likely comprise compressively strained quantum wells, compressively strained even relative to the new lattice constant. Furthermore the quantum well could comprise superlattices and/or employ strain compensation and/or comprise nitrogen. If superlattices are utilized, the lattice layers will preferably differ in at least one constituent element by at least 15%. Then a second transition region to the (AlGa)As lattice constant could be grown having similar thickness with confinement structure. Finally, a top mirror of GaAs/AlAs could be grown. Processing of the VCSEL would be much as for ordinary VCSELs and there is no issue of cleaving. Many alternatives are available. The top of the VCSEL including the top mirror could comprise material matched to In$_{0.26}$Ga$_{0.74}$As eliminating the need for the second transition region. Or the transition region could begin within the bottom mirror near its top, and the second transition region if present could extend into the lower portion of the top mirror. FIG. 4a illustrates a VCSEL with two transition regions, each extending partially into a mirror structure.

Additionally, other techniques may be used to grow semiconductor laser structures in conjunction with the invention. For example, short period superlattices may be utilized, see U.S. application Ser. No. 08/721,769 entitled "Extended Wavelength Strained Layer Lasers Having Short Period Superlattices," filed Sep. 25, 1996. This application is hereby incorporated by reference. Another technique would include the use of nitrogen in the semiconductor laser, see U.S. application Ser. No. 08/721,590 entitled "Extended Wavelength Strained Layer Lasers Having Nitrogen Disposed Therein," filed Sep. 25, 1996. This application is hereby incorporated by reference.

Figure 3A:
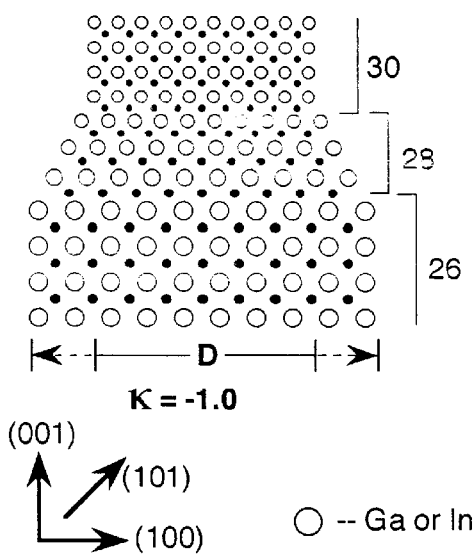
FIGS. 3a illustrates a technique for growing an arbitrarily thick layer of lattice mismatched material without the generation of misfit dislocations, where the new lattice constant is smaller than the first, in accordance with a preferred embodiment of the invention.
Figure 3B:
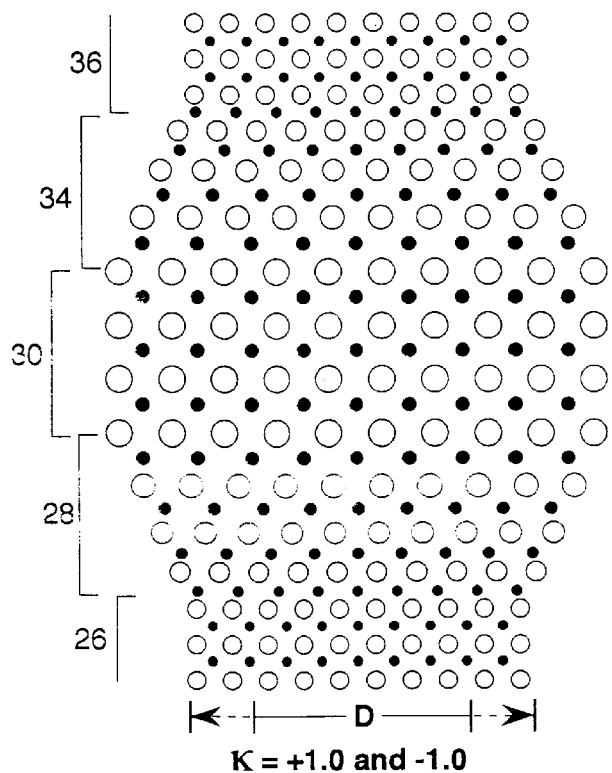
FIGS. 3b illustrates a technique for growing an arbitrarily thick layer of lattice mismatched material without the generation of misfit dislocations by using two transition regions and in accordance with a preferred embodiment of the invention.

Turning now to FIG. 3a, the case where $\kappa$=-1 is used to produce a new lattice constant which is smaller than the substrate lattice constant is illustrated. This structure may be useful, for example in producing red, orange, yellow, green or other wavelength emitting lasers on GaAs substrates. FIG. 3b illustrates a structure with 2 transition regions, exemplified by the VCSEL structure described above. In this situation, the first transition region 28 has $\kappa$=1 and the second transition region 34 has $\kappa$=-1. A second new lattice constant region 36 is grown above second transition region 34. The use of this embodiment with a VCSEL is illustrated in FIG. 4a, discussed below.

The restricted-area gradient growth described above has the enormous potential to grow unlimited thicknesses of highly-mismatched materials on device-sized regions without incurring misfit dislocations in central portions 32. As discussed above, central portions 32 will have a lateral dimension D which may or may not correspond to the full lateral extent of mesa 26. The tops of transition regions 28, 34 may be regarding as "micro-substrates," similar to ternary substrates, on which material may be grown in combinations previously not possible. It makes possible the growth of lasers on GaAs substrates which emit at >1.3 $\mu$m, 1.55 $\mu$m, or even longer wavelengths. Similarly, lasers may be fabricated on InP substrates which emit at >2.2 $\mu$m, 2.7 $\mu$m, or even much longer wavelengths. Lasers emitting at 2.7 $\mu$m or even longer may even be produced on GaAs substrates. Growth conditions may need to be optimized so that material does not migrate in either direction between edges and tops of mesa 26, which could interfere with the top surface growth.

It is also possible to form pseudomorphic "ternary substrates" by grading over very large thicknesses. For $|\kappa|$=1.0 and a 2" diameter substrate, a 1% change in lattice constant may be achieved over a 500 $\mu$m thick transition region. While 500 $\mu$m is rather large, non-graded epitaxial layers in excess of 100 $\mu$m are produced in the art. For example, 100 $\mu$m thick Al GaAs layers are produced on GaAs substrates to provide transparent "substrates" on which high-efficiency LEDs are grown. On similarly thick AlGaAs layers, 850 nm "bottom emitting" VCSELs have been fabricated, see Kohama et al. In both cases, the GaAs substrate is eventually removed; the reason for producing the thick AlGaAs layer is to provide a transparent "substrate" for the processed devices in order to handle them. However, the same 100 $\mu$m thickness could provide a ±0.2% change in lattice constant for $|\kappa|$=1.0 and a 2" diameter substrate. Even such a small change could produce significant device improvements for some applications. In particular, a -0.2% change in lattice constant from that of GaAs could provide large performance improvements in visible-emitting EELs and VCSELs. For these applications it is not necessary and probably not desirable to remove the original GaAs substrate. Larger changes in lattice constant may be produced with larger $|\kappa|$ and/or thicker transition regions. Such thick transition regions may be grown preferably by liquid phase epitaxy or by high growth rate MOCVD. The same practice may be applied to larger substrates using larger $|\kappa|$ and/or thicker transition regions. Furthermore, macroscopic or mesoscopic-sided regions, e.g., 100 $\mu$m–1000 $\mu$m across, may be patterned to form restricted-area growth surfaces on which much thinner pseudomorphic transition regions may be grown.

Devices

Turning now to FIG. 4a, a cross section of a VCSEL which incorporates the inventive teachings illustrated FIGS. 2a through 2d, 3a and 3b, is shown. For clarity, like elements have been provided with like reference numeral except that a prime has been added to each reference numeral where there is a slight difference in the particular element in this embodiment. The following discussion will focus on the differences between the elements of this embodiment and that of the preferred embodiment.

Light emitting device 100 is preferably a vertical cavity surface emitting laser (VCSEL), but it may also be a resonant-cavity light emitting diode (RCLED). Device 100 may be grown on substrate 52 having a mesa 26. Bottom mirror 102 comprises high-index layers 104 and low-index layers 106 and is grown on mesa 26. On bottom mirror 102 is grown bottom spacer 108. As may be seen, bottom mirror 102 is preferably formed on mesa 26 and in transition region 28. It should be appreciated that mirror 102 may also be partially disposed in mesa 26.

Figure 4B:
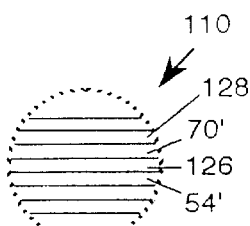

The first new lattice constant region 30 may contain active region 110. A detailed discussion of active region 110 is provided below and is illustrated in FIG. 4b. Next, the second transition region 34 partially contains a top spacer 112, and partially contains a layer forming a lens and/or aperture 114. For details on specific lenses and/or apertures and their formation, please refer to is U.S. application Ser. No. 08/547165, entitled "Conductive Element with Lateral Oxidation Barrier," filed Dec. 18, 1995; U.S. application Ser. No. 08/659,942, entitled "Light Emitting Device Having an Electrical Contact Through a Layer containing Oxidized Material," filed Jun. 7, 1996; U.S. application Ser. No. 08/686,489 entitled "Lens Comprising at Least One Oxidized Layer and Method for Forming Same," filed Jul. 25, 1996; and U.S. application Ser. No. 08/699,697 entitled "Aperture comprising an Oxidized Region and a Semiconductor Material," filed Aug. 19, 1996. These applications are hereby incorporated by reference.

Lens and/or aperture 114 has outer segments 115 which do not conduct current and may be oxidized and an inner channel which conducts current and may be non-oxidized. On top of lens and/or aperture 114 may be a top mirror 116 comprising low-index layers 118 and high-index layers 120. Bottom mirror 102 may preferably comprise alternating semiconductor layers such as GaAs or AlGaAs for layers 104 and AlAs or AlGaAs for layers 106. If substrate 52 comprises InP, bottom mirror 102 may preferably comprise alternating semiconductor and oxidized layers, such as InGaAs or InP for layers 104 and an oxide for layers 106. Top mirror 116 may comprise similar materials as bottom mirror 102, or may alternatively comprise dielectric materials. Finally, top and bottom electrical contacts 122, 124 are disposed on respective surfaces of top mirror 116 and substrate 52. As illustrated, top mirror 116 should be conductive to electrical current. Alternatively, top mirror 116 may be non-conductive, in which case electrical contact 122 should be disposed below top mirror 116. Additionally, optional isolation regions (not shown) may be provided which may be formed by ion implantation. In operation of light emitting device 100, a light beam 127 emits preferably out through top mirror 116. Alternatively, light beam 127 may emit through substrate 52.

Turning now to FIG. 4b, an exploded view of active region 110 is illustrated. This particular quantum well structure illustrates multiple quantum wells. It should be appreciated that active region 110 may have only one quantum well. The advantage of having multiple quantum wells is that for a given electron-hole density, the optical gain is increased. For convenience, quantum well 126 is constructed in a similar manner as quantum well 128. It should be appreciated that within invention, quantum well 126 may be different than quantum well 128. Barriers or confining layers 54' and 70' are disposed on either side of quantum well 126, 128. It should be appreciated that the quantum wells 126, 128 are constructed as described by the numerous techniques or combinations thereof. For example, quantum wells 126, 128 may be strain compensated, formed from superlattices or may contain small amounts of nitrogen therein. For a detained discussion on modifications to the active region, the reader is referred to U.S. application Ser. No. 08/721,589 entitled "Extended Wavelength Strained Layer Lasers Having Strain Compensated Layers," filed Sep. 25, 1996. This application is hereby incorporated by reference. It should be appreciated that these techniques are utilized in combination with high In concentrations to reduce the peak transition energy of a device, having a GaAs substrate, to allow for an emission wavelength of 1.3 μm. Thus, the quantum wells 126, 128 may be: (1) superlattice structures as discussed in the above identified co-pending U.S. patent application Ser. No. : 08/721,769; (2) may be strain compensated as discussed in the above identified co-pending U.S. patent application Ser. No.: 08/721,589; (3) may incorporate nitrogen in the active layer as discussed in the above identified co-pending U.S. patent application Ser. No.: 08/721,590, (4) may be provided with a particular orientation as determined by the orientation of substrate 52 as discussed in the above identified co-pending U.S. patent application Ser. No. 08/21,589; and/or (5) operated at an elevated or reduced temperature as discussed in the above identified co-pending U.S. patent application Ser. No. 08/721,589. Furthermore, light emitting device 100 may utilize gain offset as discussed in the above identified co-pending U.S. patent application Ser. No. 08/721,589. For brevity, individual combinations are not discussed. But, it should be appreciated that this application contemplates any combination which increases the emission wavelength to 1.3 μm or above for a GaAs substrate.

A brief summary of the above referenced patent applications will be discussed in conjunction with the inventive concepts of this invention.

To grow an increased-thickness compressively strained quantum well, a layer of tensely-strained material is grown first. Then, when the compressively-strained layer is grown to its nominal CT, the accumulated strain of the tensely-strained layer is subtracted from the accumulated strain in the well, reducing the forces which generate misfit dislocations. To a first approximation, a compressively-strained layer may be grown to about twice its nominal critical thickness before the accumulated strain force is once again at the level which will form dislocations. Finally, a second oppositely-strained layer is grown over the quantum well to bring the accumulated strain once again to approximately zero.

Nitrogen may be utilized a constituent element in the active region. Additionally, the operation temperature may be modified above or below 300K. Or a superlattice structure comprising at least two strained layers and a third layer disposed therebetween may be utilized to form the active region or layer.

These techniques may be utilized independently or in combination and are provided as examples of additional contemplated modifications to the inventive concept of this application.

It should be appreciated that merely one example of a VCSEL structure has been described. This description is merely illustrative and should in no way be viewed as limiting the invention to this particular structure. For example, the location(s) and extent(s) of the transition region(s) may vary widely. For a description of other VCSEL structures which are contemplated by the invention, please refer to FIGS. 5a through 5f of U.S. patent application Ser. No. 08/574,165 by Jewell. This application further includes other VCSEL structures including but not limited to ion implanted VCSELs and other forms of VCSELs having oxide-defined apertures which may be used in conjunction with the inventive teachings of this application and is hereby incorporated by reference. It should be appreciated that the inventive concept provides a "micro substrate" on which conventional VCSEL components may be grown or incorporated as taught in FIG. 4a.

Turning now to FIG. 5a, a cross section of an edge emitting laser or a light emitting diode, also termed in-plane laser or in-plane light-emitting diode, which incorporates the inventive teachings illustrated FIGS. 2a through 2d, 3a and 3b, is shown. A light source 100' which incorporates elements such as substrate 52', first cladding layer 130, active region 110', second cladding layer 132, top contact 122' and bottom contact 124'. In response to a current flow, light source 100' emits a beam of light, for example light beam 134 as in an edge-emitting laser. Additionally, a current blocking layer 136 may be present which may comprise a partially oxidized layer. Layer 136 has outer segments 138 which do not conduct current and may be oxidized and an inner channel 140 which conducts current and may be non-oxidized. For a detailed discussion on layer 136, the reader is referred to U.S. patent application Ser. No. 08/574, 165 by Jewell. Optionally, grating lines 142 may extend partially or completely across light source 100' to form grating 144. Such gratings on an in-plane laser may form a distributed feedback laser (DFB) laser or a distributed Bragg reflector (DBR) laser. A further option is phase shift region 146 in which grating lines 142 are shifted, typically by one quarter wave, to form a phase shifted DFB laser.

Mesa 26 is illustrated as being on substrate 52' and the same size thereof. It should be appreciated that substrate 52' may have a lateral extent which is greater than mesa 26 and is only illustrated for convenience as being the same. First transition region 28 is illustrated as being similar to that of FIG. 2a. Cladding layer 130 is grown above first transition region 28 and in the first new lattice constant material 30. It should be appreciated that cladding layer 130 may also be disposed in first transition region 28. The active region 110' is disposed in the first new lattice constant material 30. Finally, the remaining structure is grown in the first new lattice constant material 30. It should be appreciated that any of the structures illustrated in FIG. 2a through 2d, 3a and 3b or any combinations thereof, are contemplated for use with this inventive concept.

Figure 5B:
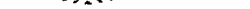

Turning now to FIG. 5b, an exploded view of active region 110' is illustrated. As may be seen, this particular quantum well structure illustrates multiple quantum wells. It should be appreciated that active region 110' may have only one quantum well. The advantage of having multiple quantum wells is that for a given electron-hole density, the optical gain is increased. For convenience, quantum well 126' is constructed in a similar manner as quantum well 128'. It should be appreciated that within the invention, quantum well 126' may be different than quantum well 128'. Barriers or confining layers 54' and 70' are disposed on either side of quantum well 126', 128'. It should be appreciated that the quantum wells 126', 128' are conducted as described by the numerous techniques or combinations thereof. For example, quantum wells 126', 128' may resemble quantum wells 58, 66 or may incorporate all of the techniques discussed in conjunction with FIG. 4b. It should be appreciated that these techniques are utilized in combination with high In concentrations to reduce the peak transition energy of a device, having a GaAs substrate, to allow for an emission wavelength of 1.3 $\mu$m. Thus, the quantum wells 126', 128' may be: (1) superlattice structures as discussed in the above superlattice section; (2) may be strain compensated as discussed above; (3) may incorporate nitrogen in the active layer as discussed above; (4) may be provided with a particular orientation as determined by the orientation of substrate 52' as also discussed above; and/or (5) operated at an elevated or reduced temperature as also discussed above. Furthermore, certain forms of light emitting device 100 may utilize gain offset as discussed above. For brevity, individual combinations are not discussed. But, it should be appreciated that this application contemplates any combination which increases the emission wavelength to 1.3 $\mu$m or above for a GaAs substrate.

It should be appreciated that merely one example of an in-plane laser structure has been described. This description is merely illustrative and should in no way be viewed as limiting the invention to this particular structure. In-plane lasers within the invention include but are not limited to Fabry-Perot EELs, distributed feedback (DFB) lasers, phase-shifted DFB lasers, distributed Bragg reflector (DBR) lasers, angle-facet surface emitting lasers and grating surface emitting lasers.

Although the present invention has been fully described in conjunction with the preferred embodiment thereof with reference to the accompanying drawings, it is to be understood that various changes and modifications may be apparent to those skilled in the art. Such changes and modifications are to be understood as included within the scope of the present invention as defined by the appended claims, unless they depart therefrom.

What is claimed:

1. A semiconductor structure, said semiconductor structure comprising:

a first layer, said first layer having a restricted growth surface having a region with a transverse dimension D, said first layer having a first lattice constant $L_1$;

a first, last and at least one intermediate transition layers, said transition layers forming a transition region, said transition region disposed above said first layer, said transition region having a vertical thickness T, and where at least one of said intermediate transition layers has lattice constants between $L_1$ and a second lattice constant $L_2$ where said first transition layer has a lattice constant closer to said $L_1$ than $L_2$ and said last transition layer has a lattice constant closer to said $L_2$ than $L_1$; and a second layer disposed on said transition region, said second layer having said second lattice constant $L_2$;

wherein:

said transition region has an average fractional change in lattice constant characterized by $\kappa$ where $\kappa = (D/T)\{(L_2 - L_1)/L_1\}$, where $0 < \kappa \leq 10$ and where $D \geq 2$ $\mu$m.

2. The semiconductor structure recited in claim 1, further comprising a substrate having a lattice constant $L_1$.

3. The semiconductor structure recited in claim 2, wherein said first layer is an integral part of said substrate.

4. The semiconductor structure recited in claim 1, wherein a lattice mismatch $|L_2 - L_1|/L_1 \geq 0.001$.

5. The semiconductor structure recited in claim 1, wherein a lattice mismatch $|L_2 - L_1|/L_1 \geq 0.002$.

6. The semiconductor structure recited in claim 1, wherein a lattice mismatch $|L_2 - L_1|/L_1 > 0.005$.

7. The semiconductor structure recited in claim 1, wherein a lattice mismatch $|L_2 - L_1|/L_1 > 0.01$.

8. The semiconductor structure recited in claim 1, wherein a lattice mismatch $|L_2 - L_1|/L_1 > 0.02$.

9. The semiconductor structure recited in claim 1, wherein a lattice mismatch $|L_2 - L_1|/L_1 > 0.03$.

10. The semiconductor structure recited in claim 1, wherein a lattice mismatch $|L_2 - L_1|/L_1 \geq 0.04$.

11. The semiconductor structure recited in claim 1, wherein $D \geq 5$ $\mu$m.

12. The semiconductor structure recited in claim 1, wherein $D \geq 10$ $\mu$m.

13. The semiconductor structure recited in claim 1, wherein $D \geq 25$ $\mu$m.

14. The semiconductor structure recited in claim 1, wherein $D \geq 50$ $\mu$m.

15. The semiconductor structure recited in claim 1, wherein $T \geq 30$ Å.

16. The semiconductor structure recited in claim 1, wherein $T \geq 100$ Å.

17. The semiconductor structure recited in claim 1, wherein $T \geq 300$ Å.

18. The semiconductor structure recited in claim 1, wherein $T \geq 1000$ Å.

19. The semiconductor structure recited in claim 1, wherein T≧3000 Å.

20. The semiconductor structure recited in claim 1, wherein said restricted growth surface, is an etched mesa.

21. The semiconductor structure recited in claim 1, wherein said restricted growth surface is an etched recess.

22. The semiconductor structure recited in claim 1, wherein said restricted growth surface is defined by pattern disorienting a portion of said substrate.

23. The semiconductor structure recited in claim 1, wherein said restricted growth surface is defined by a patterned material which differs from that of said first layer.

24. The semiconductor structure recited in claim 23, wherein said material which differs from that of said first layer is silicon nitride.

25. The semiconductor structure recited in claim 23, wherein said material which differs from that of said first layer is silicon dioxide.

26. The semiconductor structure recited in claim 1, further comprising a substrate having a transverse dimension≧21 mm and $|\kappa| \leq 7$.

27. The semiconductor structure recited in claim 1, further comprising:
   a substrate disposed in communication with said first layer;
   a light emitting active layer disposed above said at least one intermediate transition layer;
   a first conductive layer having a first conductivity type, said first conductive layer disposed in electrical communication with said active layer;
   a second conductive layer having a second conductivity type, said second conductive layer being disposed above said active layer and in electrical communication therewith; and
   electrical communication means for providing electrical current to said active layer, thereby forming a light emitting device.

28. The semiconductor structure recited in claim 27, wherein said active layer has a peak transition wavelength of at least 1.24 μm and wherein said substrate comprises GaAs.

29. A The semiconductor structure recited in claim 27, wherein said substrate comprises GaAs.

30. The semiconductor structure recited in claim 27, wherein said substrate has an orientation between 0° and 4° off the (001) orientation.

31. The semiconductor structure recited in claim 27, wherein said active layer has an average sum of In and Sb concentrations of greater than 35% of the type three semiconductor material.

32. The semiconductor structure recited in claim 27, wherein said light emitting active layer comprises at least two strained layers, and a third layer disposed between said two layers, said two layers and said third layer forming a superlattice.

33. The semiconductor structure recited in claim 32, wherein at least two adjacent superlattice layers differ in at least one constituent element by at least 15%.

34. The semiconductor structure recited in claim 27, further comprising a bottom mirror disposed below said active layer and a top mirror disposed above said active layer, said top and bottom mirrors and all material between defining an optical cavity having a cavity resonance at a resonance wavelength corresponding to a resonance energy; said resonance wavelength in μm, as measured in vacuum, being equal to 1.24 divided by said resonance energy, in electron volts.

35. The device recited in claim 34, wherein said substrate is GaAs and a resonance wavelength of at least 1.3 μm occurs with said active layer at a temperature of 300K or less.

36. The device recited in claim 34, wherein said substrate is GaAs aid a resonance wavelength of at least 1.3 μm occurs with said active layer at a temperature greater than 300K.

37. The semiconductor structure recited in claim 34, wherein said bottom mirror comprises alternating high-index layers and low-index layers.

38. The semiconductor structure recited in claim 37, wherein said low index layers comprise oxidized material.

39. The semiconductor structure recited in claim 34, wherein said top mirror, comprises alternating low index layers and high index layers.

40. The semiconductor structure recited in claim 39, wherein said low index layers are selected from the group consisting of: oxidized material, low-index dielectric material, relatively-low-index semiconductor material, and any combination thereof.

41. The semiconductor structure recited in claim 39, wherein said high index layers are selected from the group consisting of: high-index dielectric material, high-index semiconductor material and any combination thereof.

42. The semiconductor structure recited in claim 34, further comprising an aperture disposed between said active layer and said top mirror, said aperture having a first and second region.

43. The semiconductor structure recited in claim 42, wherein said first region exhibits high electrical resistance; and second region and has an electrical resistance at least three times lower that an electrical resistance of said first region.

44. The semiconductor structure recited in claim 42, wherein said first region is oxidized and said second region is oxidized less than said first region.

45. The semiconductor structure recited in claim 27, further comprising a grating layer disposed above said second conductive layer, said grating layer having grating lines extending at least partially or completely across said active region to form a grating, said grating defining an optical cavity having a cavity resonance at a resonance wavelength corresponding to a resonance energy; said resonance wavelength in μm, as measured in vacuum, being equal to 1.24 divided by said resonance energy, in electron volts.

46. The semiconductor structure recited in claim 45, wherein at least one of said grating lines is shifted by approximately least one quarter wave or a multiple thereof to form a phase shift grating.

47. The semiconductor structure recited in claim 1, further comprising a first strained layer having a nominal lattice constant smaller than $L_2$ and being disposed between said substrate and a pseudomorphic light emitting active layer, said pseudomorphic light emitting active layer disposed above said last transition layer, said active layer comprising at least one layer having a nominal lattice constant larger than $L_2$.

48. The semiconductor structure recited in claim 1, further comprising a light emitting active layer disposed above said last transition layer, said active layer comprising at least In, Ga, As and N.

49. A semiconductor structure, said semiconductor structure comprising:
   a first layer, said first layer having a restricted growth surface having a transverse dimension D, said first layer having a first lattice constant $L_1$;

a first, last and at least one intermediate transition layers, said transition layers forming a transition region, said transition region disposed above said first layer, said transition region having a vertical thickness T, and where at least one of said intermediate transition layers has lattice constants between $L_1$ and a second lattice constant $L_2$ where said first transition layer has a lattice constant closer to said $L_1$ than $L_2$ and said last transition layer has a lattice constant closer to said $L_2$ than $L_1$; and a second layer disposed on said transition region, said second layer having said second lattice constant $L_2$; wherein:

said transition region has an average fractional change in lattice characterized by $\kappa$ where $\kappa=(D/T)\{(L_2-L_1)/L_1\}$, where $0<|\kappa|\leq 10$.

50. The semiconductor structure recited in claim 49, wherein said semiconductor structure is grown on a substrate having a transverse dimension $\geq 30$ mm.

51. The semiconductor structure recited in claim 49, wherein a lattice mismatch $|L_2-L_1|/L_1 \geq 0.01$.

52. The semiconductor structure recited in claim 49, wherein a lattice mismatch $|L_2-L_1|/L_1 \geq 0.03$.

53. The semiconductor structure recited in claim 49, wherein $D \geq 2$ μm.

54. The semiconductor structure recited in claim 49, wherein $D \geq 10$ μm.

55. The semiconductor structure recited in claim 49, wherein $D \geq 25$ μm.

56. The semiconductor structure recited in claim 50, wherein $T \geq 1000$ Å.

57. A semiconductor structure grown on a substrate having a transverse dimension $\geq 21$ mm, said semiconductor structure comprising:

a first layer, said first layer having a restricted growth surface having a transverse dimension D, said first layer having a first lattice constant $L_1$;

a first, last and at least one intermediate transition layers, said transition layers forming a transition region, said transition region disposed above said first layer, said transition region having a vertical thickness T, and where at least one of said intermediate transition layers has lattice constants between $L_1$ and a second lattice constant $L_2$, where said first transition layer has a lattice constant closer to said $L_1$ than $L_2$ and said last transition layer has a lattice constant closer to said $L_2$ than $L_1$; and a second layer disposed on said transition layer, said second layer a second lattice constant $L_2$; wherein:

said second layer has a transverse dimension $D_2$, where $D_2=D+D\{(L_2-L_1)/L_1\}$.

58. A semiconductor structure grown on a substrate having a transverse dimension $\geq 21$ mm, said semiconductor structure comprising:

a first layer, said first layer having a restricted growth surface having a transverse dimension D, said first layer having a first lattice constant $L_1$;

a first, last and at least one intermediate transition layers, said transition layers forming a transition region, said transition region disposed above said first layer, said intermediate transition region having a vertical thickness T, and where at least one of said transition layers has lattice constants between $L_1$ and a second lattice constant $L_2$, where said first transition layer has a lattice constant closer to said $L_1$ than $L_2$ and said last transition layer has a lattice constant closer to said $L_2$ than $L_1$; and a second layer disposed on said transition region, said second layer having said second lattice constant $L_2$; wherein said transition region having an average fractional change in lattice constant characterized by $\kappa$ where $\kappa=(D/T)\{(L_2-L_1)/L_1\}$, where $D \geq 1$ μm and the lattice mismatch between $L_1$ and $L_2$ is defined by $(L_2-L_1)/L_1$ and is $\geq 3\times 10^2$ and $0<\kappa \leq 100$.

59. The semiconductor structure recited in claim 56, wherein said semiconductor structure has $\leq 10^3$ defects/cm$^2$.

60. A semiconductor structure grown on a substrate having a transverse dimension $\geq 21$ mm, said semiconductor structure comprising:

a first layer, said first layer having a restricted growth surface having a transverse dimension D, said first layer having a first lattice constant $L_1$;

a first, last and at least one intermediate transition layers, said transition layers forming a transition region, said transition region disposed above said first layer, said transition region having a vertical thickness T, and where at least one of said intermediate transition layers has lattice constants between $L_1$ and a second lattice constant $L_2$, where said first transition layer has a lattice constant closer to said $L_1$ than $L_2$ and said last transition layer has a lattice constant closer to said $L_2$ than $L_1$; and a second layer disposed on said transition region, said second layer having said second lattice constant $L_2$; wherein:

said second layer has a thickness $\geq 1.2$CT, where:

$$CT=(0.4374/f)[ln(CT/4)+1],$$

where f is an average lattic mismatch of said second layer normalized to a lattice constant of said substrate; and said transition region having an average fractional change in lattice constant characterized by $\kappa$ where $\kappa=(D/T)\{(L_2-L_1)/L_1\}$, where the lattice mismatch is defined by $\{(L_2-L_1)/L_1\}$, and where both D and said lattice mismatch are selected from region to the right of and including a line defined by Log $D \geq -3.5$ Log $\{(L_2-L_1)/L_1\}-6$, where D is measured in μm.

61. The semiconductor structure recited in claim 60, wherein said semiconductor structure has $\leq 10^3$ defects/cm$^2$.

62. The semiconductor structure recited in claim 1, wherein said semiconductor structure was grown on a substrate, and said semiconductor structure further comprising:

a light emitting active layer disposed above said at least one intermediate transition layer;

a first conductive layer having a first conductivity type, said first conductive layer disposed in electrical communication with said active layer;

a second conductive layer having a second conductivity type, said second conductive layer being disposed above said active layer and in electrical communication therewith; and electrical communication means for providing electrical current to said active layer, thereby forming a light emitting device.

* * * * *